(12) United States Patent
Chu et al.

(10) Patent No.: US 10,844,477 B2
(45) Date of Patent: Nov. 24, 2020

(54) ELECTROMAGNETIC MODULE FOR PHYSICAL VAPOR DEPOSITION

(71) Applicant: Taiwan Semiconductor Manufacturing Co., Ltd., Hsinchu (TW)

(72) Inventors: Hsuan-Chih Chu, Hsinchu (TW); Chien-Hsun Pan, Hsinchu (TW); Yen-Yu Chen, Taichung (TW); Chun-Chih Lin, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 227 days.

(21) Appl. No.: 15/806,729

(22) Filed: Nov. 8, 2017

(65) Prior Publication Data

US 2019/0136369 A1    May 9, 2019

(51) Int. Cl.
| C23C 14/54 | (2006.01) |
| C23C 14/35 | (2006.01) |
| C23C 14/34 | (2006.01) |
| H01J 37/34 | (2006.01) |
| H01L 21/285 | (2006.01) |
| H01L 21/67 | (2006.01) |

(52) U.S. Cl.
CPC .......... *C23C 14/54* (2013.01); *C23C 14/3407* (2013.01); *C23C 14/355* (2013.01); *H01J 37/3458* (2013.01); *H01L 21/2855* (2013.01); *H01L 21/67253* (2013.01)

(58) Field of Classification Search
None
See application file for complete search history.

(56) References Cited

U.S. PATENT DOCUMENTS

| 6,805,779 | B2 | 10/2004 | Chistyakov | |
| 9,305,754 | B2 | 4/2016 | Chueh et al. | |
| 9,567,668 | B2 * | 2/2017 | Chi | H01J 37/3405 |
| 2004/0050690 | A1 * | 3/2004 | Green | H01J 37/3408 |
| | | | | 204/192.13 |
| 2006/0081459 | A1 * | 4/2006 | Tsai | C23C 14/35 |
| | | | | 204/192.13 |

FOREIGN PATENT DOCUMENTS

| CN | 102443770 | 5/2012 |
| TW | 200532039 | 10/2005 |
| TW | 200935985 | 8/2009 |
| TW | 201024447 | 7/2010 |
| TW | 201241214 | 10/2012 |

* cited by examiner

*Primary Examiner* — John J Brayton
(74) *Attorney, Agent, or Firm* — Haynes and Boone, LLP

(57) ABSTRACT

Sputtering systems and methods are provided. In an embodiment, a sputtering system includes a chamber configured to receive a substrate, a sputtering target positioned within the chamber, and an electromagnet array over the sputtering target. The electromagnet array includes a plurality of electromagnets.

20 Claims, 7 Drawing Sheets

ELECTROMAGNETIC MODULE FOR PHYSICAL VAPOR DEPOSITION

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

Physical vapor deposition (PVD) or sputtering has been widely used to deposit material layers to form gate stacks, barrier layers, and interconnect structures of semiconductor devices. In commonly seen sputtering processes, a target and a substrate is placed face-to-face in close proximity within a sputtering chamber. A gas is introduced into the sputtering chamber, where the gas is ignited to form a plasma. The gas ions in the plasma are drawn to the target by an electric field across the target, the back plate and the substrate. With sufficient energies, gas ions can dislodge atoms off of the target, allowing the dislodged target atoms to be deposited on the substrate. In reactive sputtering, a reactive gas is also introduced into the sputtering chamber and the target atom reacts with the reactive gas before depositing on the substrate.

Conventionally, to promote uniform erosion over the target surface, a rotating magnet module is used to apply a sweeping magnetic field over the target. The rotating magnet module may include an arrangement of permanent magnets that is rotated by a rotational mechanism around a center of the target. However, this conventional technique often results in uneven circular erosion patterns on the target, commonly known as the "racetracks." Moreover, the rotational mechanism may displace magnets at or near the center of the rotating magnet module, resulting in under-erosion at or near the center of the target.

Thus, existing techniques have not proved entirely satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features, whether on the devices or the wafers and semiconductor features described herein, may be arbitrarily increased or reduced for clarity of discussion.

Figure 1:
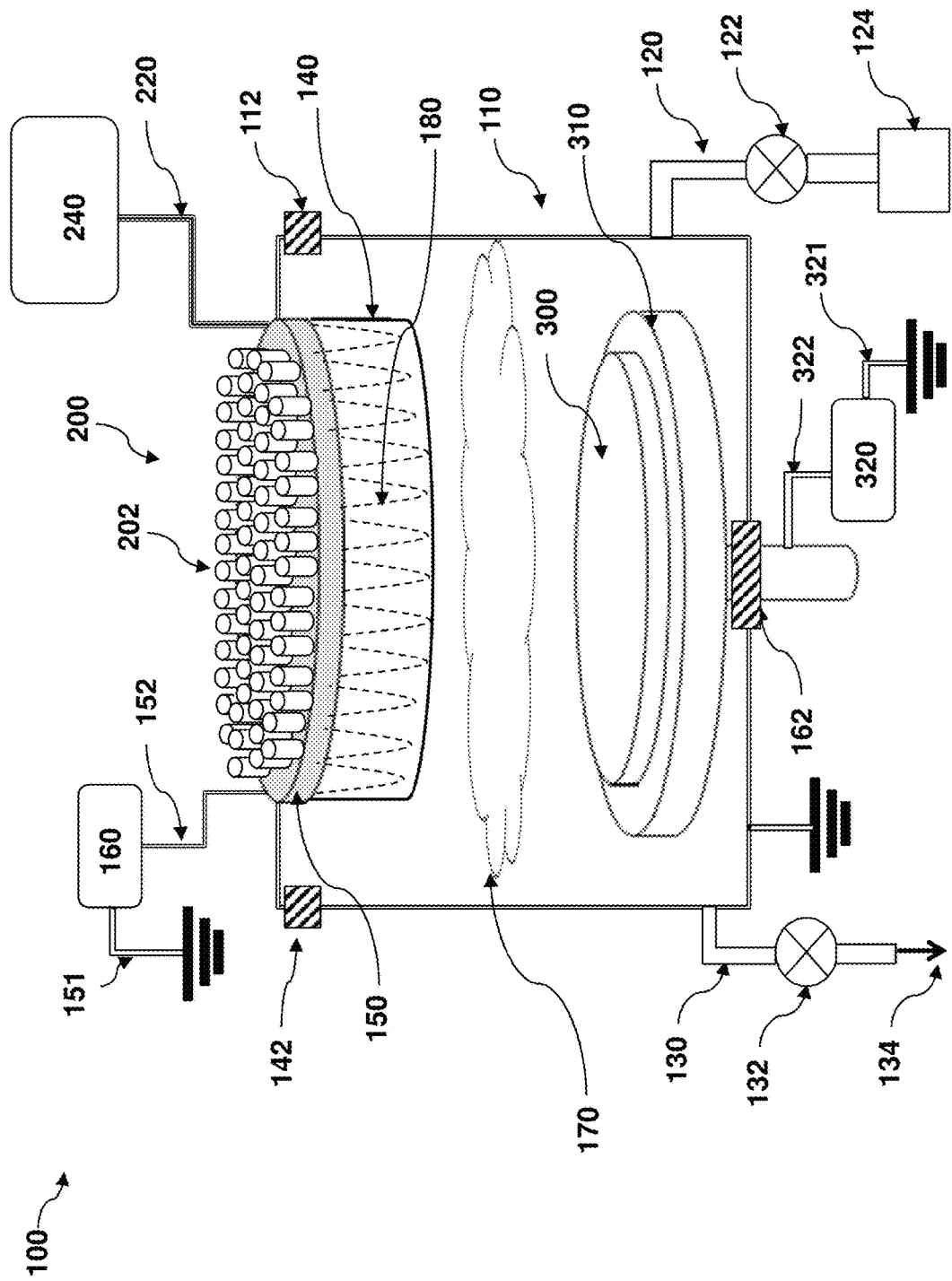
FIG. 1 is a schematic diagram of a sputtering system, according to various embodiments of the present disclosure.

These figures will be better understood by reference to the following detailed description.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is further understood that the present disclosure relates generally to improving target erosion uniformity and deposition uniformity by use of a controllable electromagnet module over the target. More particularly, the present disclosure is related to an electromagnet array of individually controllable electromagnet. The electromagnet array not only can apply a static or sweeping magnetic field that promotes uniform target erosion but also can be dynamically tuned to address localized over- and under-erosion on the target. A controller connected to the electromagnet array can transmit an alternating current (AC) signal to each of the electromagnet such that an eddy current is generated in an area of a target adjacent to the electromagnet. By comparing impedance variations among the electromagnets, the location and depth of an erosion feature can be determined. The wafers and substrates described herein may take various forms including but not limited to wafers (or portions thereof) or substrates of individual devices such as chips (e.g., fabricated on a wafer). Various features may be formed on the substrate by the addition, subtraction, and alteration of material layers formed on the substrate to produce integrated circuits including those formed by CMOS-based processes, fin-like field effect transistor (FinFET) devices, MEMS devices, image sensors, and the like. Furthermore, as described above, specific embodiments described herein are exemplary only and not intended to be limiting.

Referring now to FIG. 1, shown therein is a schematic diagram of a sputtering system 100, according to various embodiments of the present disclosure. The sputtering system 100 includes a vacuum chamber 110. The vacuum chamber 110 is in fluid communication with a vacuum source 134 via a passage 130. The vacuum source 134 can include one or more vacuum pumps. The passage 130 further includes a valve 132, which is operable to shut off the fluid communication between the vacuum chamber 110 and the vacuum source 134. The vacuum chamber 110 is also in fluid communication with a gas source 124 via a passage 120. The gas source 124 is a source of gas used to generate a plasma within the vacuum chamber 110. In some embodiments, the gas is an inert gas, such as argon. In some other embodiments, the gas can be oxygen or nitrogen. In some instances, there are more than one gas source and at least one of the gas sources is a source of an inert gas, such as argon. The passage 120 to the gas source 124 is controlled by a valve 122, which is operable to modulate gas flow or completely shut off the fluid communication between the vacuum chamber 110 and the gas source 124. The sputtering system 100 further includes a pedestal 310 for holding a substrate 300. The substrate 300 can be a wafer, part of a wafer, or a substrate with fabricated features thereon.

The sputtering system 100 is configured to receive a target 140 (or sputtering target 140) within the vacuum chamber 110. The target 140 can be formed of a metal, a conductive metallic compound, an alloy, or a metal solid solution. In some embodiments, the target 140 can be mounted on a back plate 150. Non-exhaustive examples of materials for the target 140 and back plate 150 include aluminum (Al), copper (Cu), gold (Au), nickel (Ni), cobalt (Co), manganese (Mn), titanium (Ti), tantalum (Ta), graphite (C), tungsten (W), ruthenium (Ru), molybdenum (Mo), niobium (Nb), palladium (Pd), indium (In), gallium (Ga), boron (B), antimony (Sb), vanadium (V), tin (Sn), ytterbium (Yb), yttrium (Y), zirconium (Zr), chromium (Cr) and alloys and solid solutions thereof. The back plate 150 and the target 140 can be formed of the same material or different materials. In some implementations, the back plate 150 is formed of materials with properties that compensate for the material properties of the target 140. For example, in cases where the material of the target 140 has low thermal conductivity, the material of the back plate 150 can be those with high thermal conductivity. Besides thermal conductivity, material properties to be considered can include electrical and magnetic conductivities.

As shown in FIG. 1, the substrate 300 is mounted on the pedestal 310, which is electrically coupled to a power supply 320 via a transmission line 322, and the target 140 is coupled to a power supply 160 via the back plate 150 and a transmission line 152. That way, an electric field can be applied across the target 140 and the pedestal 310. Both the pedestal 310 and the back plate 150 are made of conductive materials. In some embodiments, the power supply 320 is a radio frequency (RF) power supply having the transmission line 322 connecting to the pedestal 310 and a grounding line 321 connected to the ground. The conductive pedestal 310 that is connected to the power supply 320 is insulated from the vacuum chamber 110 by an insulation member 162. In some instances, the power supply 160 is a direct current (DC) power supply having the transmission line 152 connecting to the back plate 150 and a grounding line 151 connected to the ground. In some embodiments represented by FIG. 1, the back plate 150 and/or the structure that supports it is insulated from the vacuum chamber 110 by insulation members 112 and 142. The vacuum chamber 110 is therefore insulated by the insulation members 112, 142, and 162 from the power supply 320 and the power supply 160. The vacuum chamber can be grounded, as shown in FIG. 1.

In operation, the back plate 150 and the target 140 serve as a cathode and the pedestal 310 serves as an anode. The power supplies 160 and 320 can apply a static or a dynamically changing voltage across the cathode and the anode and thereby cause an electric field to be developed between the cathode and anode. The strength of the electric field, which is generated by the power supply 160, the power supply 320, or the combination of the two, is selected such that the gas from the gas source 124 can be ionized and ignited into a plasma 170. In instances where argon (Ar) is fed from the gas source 124, Ar atoms will give up an electron and exist in the plasma 170 as positively charged argon ions ($Ar^+$). As illustrated in FIG. 1, the positively charged argon ion in the plasma 170 will be accelerated by the electric field and bombard the surface of the target 140. If the positively charged argon ion carries sufficient energy, it can dislodge atoms of the target, which are then deposited on the substrate 300.

In some embodiments, the sputtering system 100 further includes an electromagnet module 200 over the target 140. The electromagnet module 200 comprises of an electromagnet array of a plurality of electromagnets 202. In this regard, because the electromagnet module 200 essentially refers to the electromagnet array, the electromagnet module 200 can be referred to the electromagnet array 200 from time to time. The electromagnet array 200 can be used to generate a magnetic field 180 near the target 140. The magnetic field 180 can be designed to trap electrons near the target, thereby increasing the density of the plasma 170, increasing ionization rate, and facilitating the sputtering process. In some embodiments, the electromagnet module 200 is connected to a controller 240 via a transmission line 220. The controller 240 can control the magnitude and polarity of the magnetic flux of each of the electromagnets 202 in the electromagnet module 200. That is, the magnetic field that is generated near the target 140 can be customized by changing the parameters or programs of the controller 240 for different geometries of the vacuum chamber 110, different materials of the target 140, different thicknesses of the target 140, different plasma gas species, and different electric field strengths. In some embodiments, for a given vacuum chamber 110 and a given type of target 140, experiments can be conducted to determine a default setting (or default pattern, default magnetization pattern) for the electromagnet array 200. The default setting is determined based on uniformity of deposition rate on the substrate 300 and the uniformity of the consumption rate of the target 140 for a given set of target material and process parameters. Each of the given set of target material and process parameters can be referred to as a standard setting. In some embodiments, each standard setting can correspond to a unique default pattern of the electromagnet array 200 to achieve uniform deposition rate and uniform target consumption. In some other embodiments, the default pattern of the electromagnet array 200 can be determined based on a standard setting that includes a target material with mid-range target properties and mid-range process parameters. In those embodiments, the default pattern is a general one for all target materials and process parameters. In some implementations, unless the controller 240 is commanded to use a specific pattern, the default pattern is loaded at the initiation of a sputtering process using the sputtering system 100.

Figure 2:
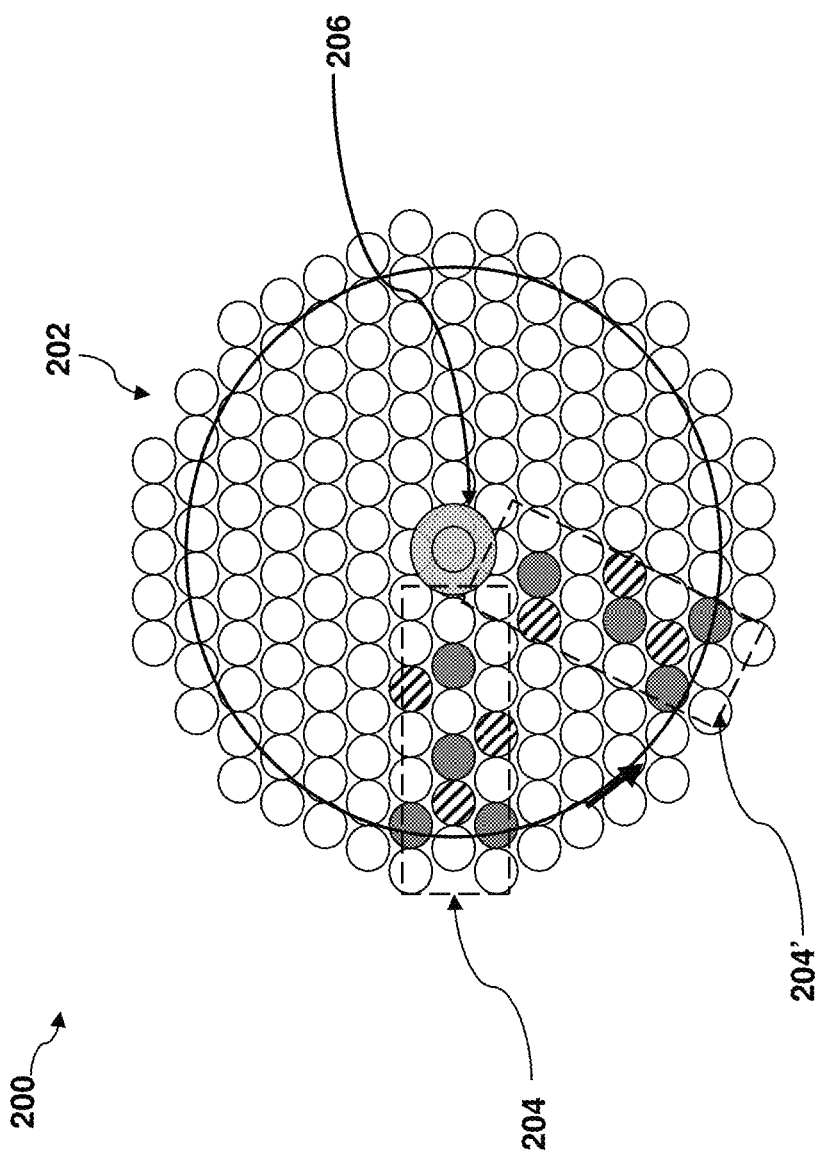
FIG. 2 is a schematic top view of an electromagnet module, according to various embodiments of the present disclosure.

Referring now to FIG. 2, shown therein is a schematic top view of the electromagnet array 200, according to embodiments of the present disclosure. In some embodiments where the substrate 300 in FIG. 1 is circular in shape, the pedestal 310 and the back plate 150 can also be circular and of the same size of the substrate 300. In those embodiments, the electromagnet module 200 also has a circular shape that generally tracks the shape of the substrate 300. However, as the electromagnet module 200 is formed of a plurality of electromagnets 202, the shape of the electromagnet module 200 may only approximate a circle but is not perfectly circular, as shown in FIG. 2. In some instances, the electromagnet module 200 is larger than the target 140 such that the target 140 is subject to a more uniform magnetic field. The electromagnet array 200 can have a center point 206, which can be either a geometric center or a center of gravity of the electromagnet array 200. In some embodiments, the controller 240 can selectively energize a group of electromagnets 202 that form a energization pattern 204 (or pattern 204). When in use, electromagnets 202 within the energization pattern 204 is energized at a predetermined level to have magnetic fluxes with different polarities and magnitudes, while the electromagnets 202 outside the pattern 204 is energized at a constant level or baseline level. For illustration purposes, electromagnets 202 in the pattern 204 are shown in different colors to illustrate that they can have different polarities, such as N pole and S pole, or different magnitudes. In these embodiments, the controller 240 can sequentially and sweepingly, in a clockwise or counter-clockwise direction, energize a group of electromagnets 202 have a pattern substantially similar to pattern 204, around the center point 206. The sweeping energization of patterns 204 allows the electromagnet array 200 to mimic rotation of a fixed magnet arrangement around the center point 206. For example, after the controller 240 energizes the pattern 204, it can continue to sweep in counter-clockwise direction and subsequently energize a pattern 204', which is similar but not identical to the pattern 204. The sweeping pattern 204 at different positions on the electromagnet array 200 may not be identical because the packing of the electromagnets 200 may not allow the same pattern 204 to be reproduced at all angles around the center point 206.

Figure 3:
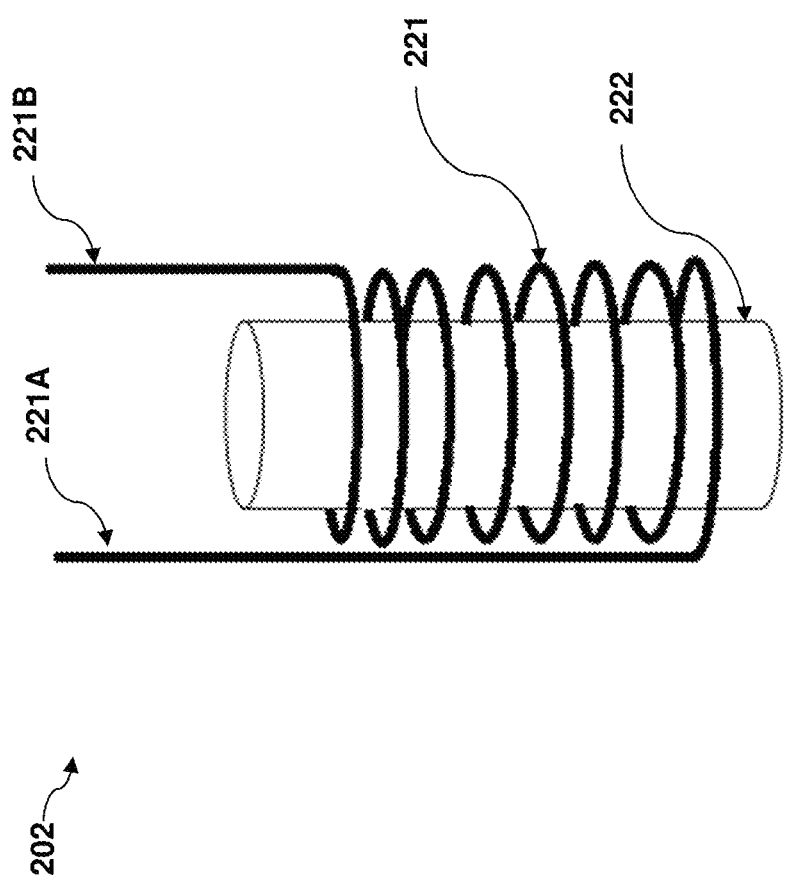
FIG. 3 is a schematic diagram of an electromagnet of an electromagnet module, according to various embodiments of the present disclosure.

As shown in FIGS. 1 and 2, the individual electromagnets 202 in the electromagnet array 200 can be generally cylindrical in shape with a circular cross section. In some implementations, to increase the packing density of the electromagnets in the electromagnet array 200, the electromagnets 202 can be made into other shapes. For example, to maximize the packing density of the electromagnet array 200, the electromagnets 202 can be in the shape of a hexagonal prism (a cylinder with a hexagonal cross section). In some other instances, the electromagnets 202 can be in the shape of a rectangular column. In still other embodiments, the electromagnets 202 can have low profiles and are considered disk-like (circular, hexagonal, or circular) in shape. An individual electromagnet 202 is shown in FIG. 3. The electromagnet 202 includes a coil 221 and a core 222. The coil 221 is made of highly conductive materials, such as copper or copper aluminum alloy. The core can be made of iron, iron alloys, nickel alloys, or iron-nickel alloys. The coil 221 includes two leads 221A and 221B. Both leads 221A and 221B are connected to the controller 240. In some embodiments, the leads of each of the electromagnets 202 are individually connected to the controller 240. In those embodiments, the smallest controllable unit in the electromagnet array 200 is an electromagnet 202 and the controller 240 can individually energize each electromagnet 202. In some other embodiments, electromagnets 202 are first grouped according to the magnitudes and polarities of their magnetic fluxes. The leads of electromagnets 202 of the same group are first merged before they are connected to the controller 240 as a group. In those embodiments, the smallest controllable unit in the electromagnet array 200 is a group of electromagnets 202 and the controller 240 can energize a group individually.

Figure 4:
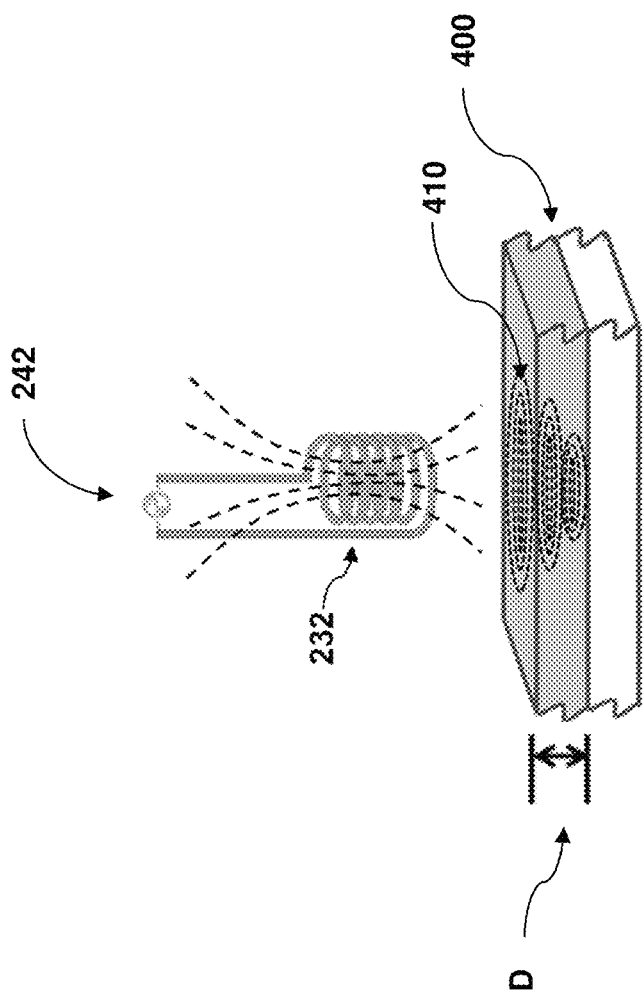
FIG. 4 is a schematic diagram of an electromagnet coil that generates an eddy current in a target, according to various embodiments of the present disclosure.

Referring now to FIG. 4, shown therein a coil 232 that is in proximity of a conductive material 400. In some embodiments, each of the electromagnets 202 in the electromagnet array 200 includes one coil 232 in addition to the coil 221. In some other embodiments, the coil 221 includes the coil 232. As shown in FIG. 4, the coil 232 is connected to an alternating current (AC) power supply 242. When the AC power supply 242 feeds an AC signal with a frequency "F" to the coil 232, an eddy current 410 is induced within the conductive material 400. The eddy current 410 circulates in planes perpendicular to the magnetic field generated by the coil 232 near the surface of the conductive material 400. The eddy current 410 would generate a magnetic field that opposes the magnetic field generated by the coil 232, causing a change in impedance in the coil 232. The impedance can be measured. The eddy current 410 has a standard depth of penetration "D," which equals the depth at which the eddy current density decreases to 1/e or 37% (wherein e is the Euler's Constant) of the eddy current density at the surface of the conductive material 400. At the depth of two Ds, the eddy current density would decrease to $1/e^2$ (or about 13.5%) of the surface eddy current density. Further, at the depth of three Ds, the eddy current density would drop to $1/e^3$ (or about 5%) of the surface eddy current density. At the depth of 5 Ds, the eddy current density would be below 1% of the surface eddy current density. The frequency F and the standard depth of penetration D are correlated by the following formula:

$$D \approx \frac{1}{\sqrt{\pi F \mu \sigma}}$$

where π is the mathematical constant that is approximately 3.14, μ is the magnetic permeability (H/mm), and σ is the electrical conductivity (in % IACS (International Annealed Copper Standard). By varying the frequency F of the AC signal from the AC power supply 242, the eddy current 410 would have different standard depth of penetration D. According to the formula presented above, the standard depth of penetration D is inversely proportional to the square root of the frequency F. That is, the standard depth of penetration D becomes smaller when the AC signal from the power supply 242 has a higher frequency F.

Figure 5:
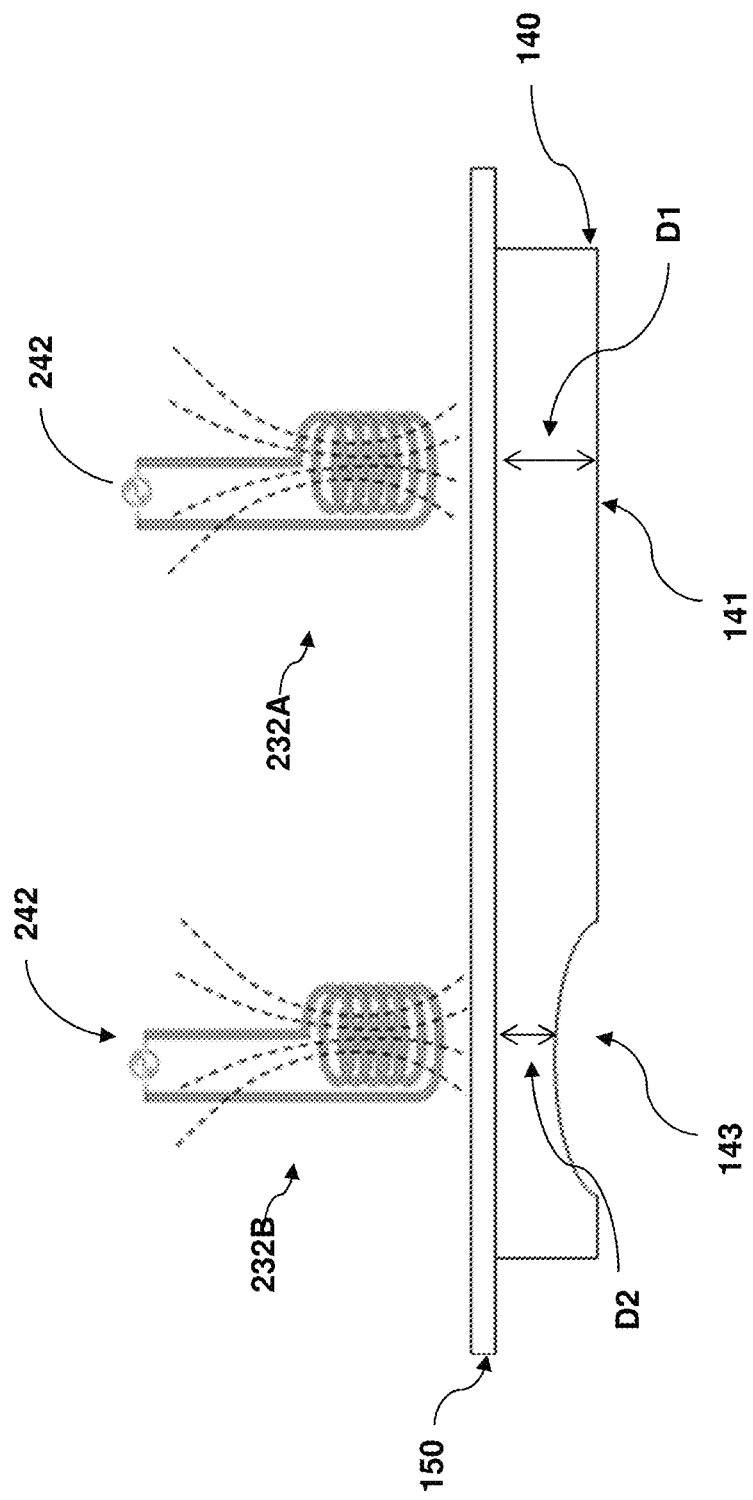
FIG. 5 is a schematic diagram of two electromagnet coil over different target erosion profiles, according to various embodiments of the present disclosure.

The eddy current 410 would decrease if a defect or a feature in the conductive material disrupts or reduces the eddy current. For example, given that the eddy current 410 mainly flows within about 5 standard depths of penetration (D), if the conductive material 400 becomes much less than 5 standard depth of penetration, the total eddy current would drop because the depth does not support the same thickness of the eddy current. The reduced eddy current would result in reduced magnetic field to counteract the magnetic field generated by the coil 232, this reducing the impedance. Variation of impedance in the coil 232 can be measured to determine presence of erosion features in the target 140. Referring now to FIG. 5, shown there are two coils 232A and 232B used to measure presence of an erosion feature 143. The coil 232A is over a portion 141 of the target 140 where a thickness D1 is uniform. The coil 232B, however, is over the erosion feature 143 that includes a concave erosion profile that reduces the local thickness of the target 140 to D2 or otherwise disrupt the flow of an eddy current inducible at the location of the concave erosion profile. Although shown in FIG. 5 as a concave profile, the erosion feature 143 can take many different shapes. The concave erosion profile of the erosion feature 143 can indicate a localized consumption, or localized over-consumption of the sputtering target 140. In instances where the AC power supply 242 transmits an AC signal with a frequency F, the eddy current induced within the target would have standard depth of penetration D. For example, if D1 is greater than or equal to 5 standard depths of penetration (5Ds) or more and D2 is smaller than 5 standard depths of penetration (5Ds), the coils 232A and 232B would experience different impedances. This is so because the erosion feature 143 takes conductive target away or disrupt the flow of the eddy current such that the eddy current density around the erosion feature 143 is weaker or at least different from that around the portion 141. In some embodiments, by varying the frequency F of the AC signals fed to the coils 232 and comparing impedance variations among different coils 232, the location and depth of the erosion feature 143 can be determined. In some other embodiments, a table of standard impedance measurements for a target at a range of frequencies can be populated by measuring impedances in the coil 232 over a think target. Any abnormal impedance values can then detected by comparing the measured impedance to the impedance values in the table of standard impedance measurements.

Figure 6A:
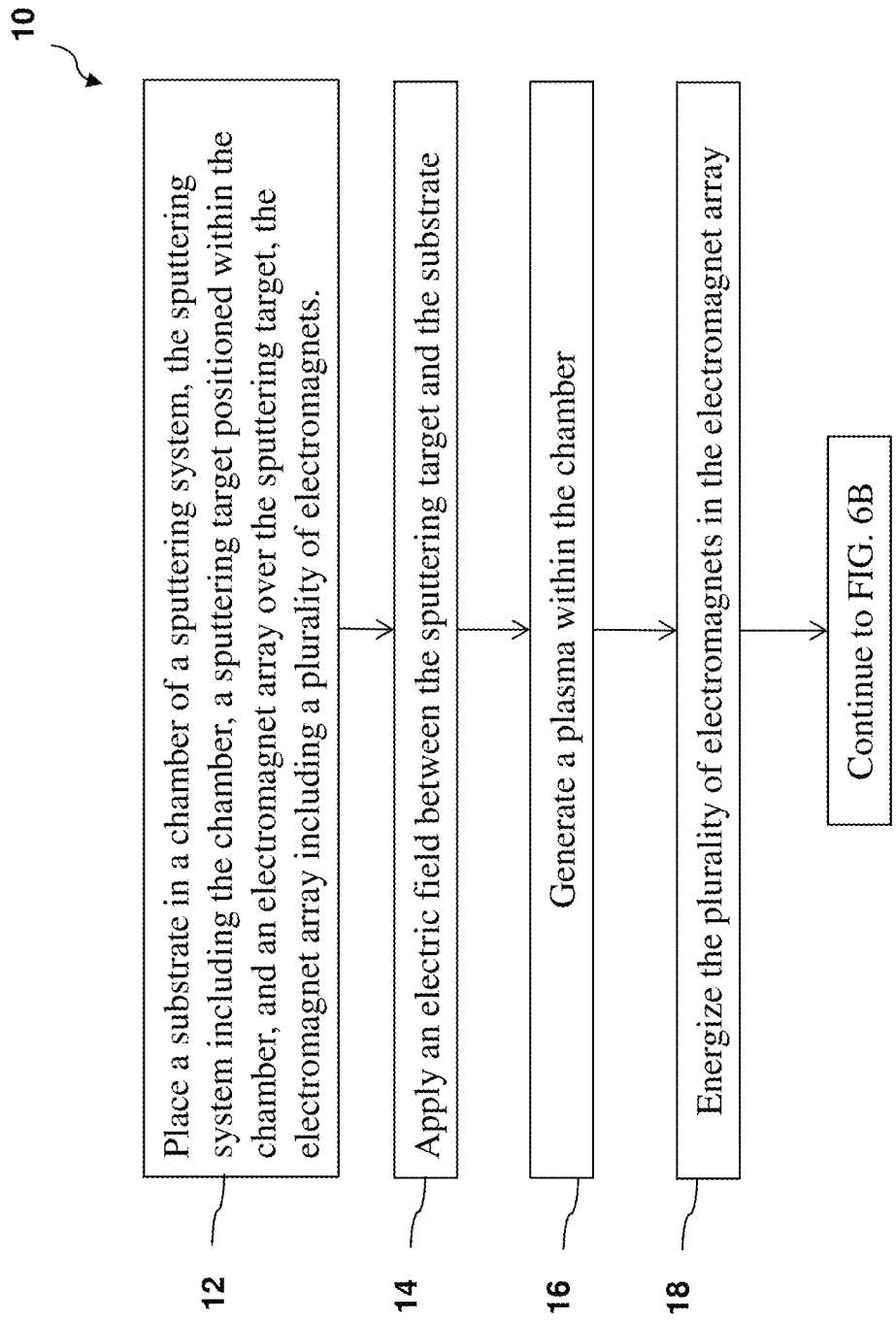
FIGS. 6A and 6B illustrate a flow chart of a method of depositing a material on a substrate, according to various embodiments of the present disclosure.
Figure 6B:
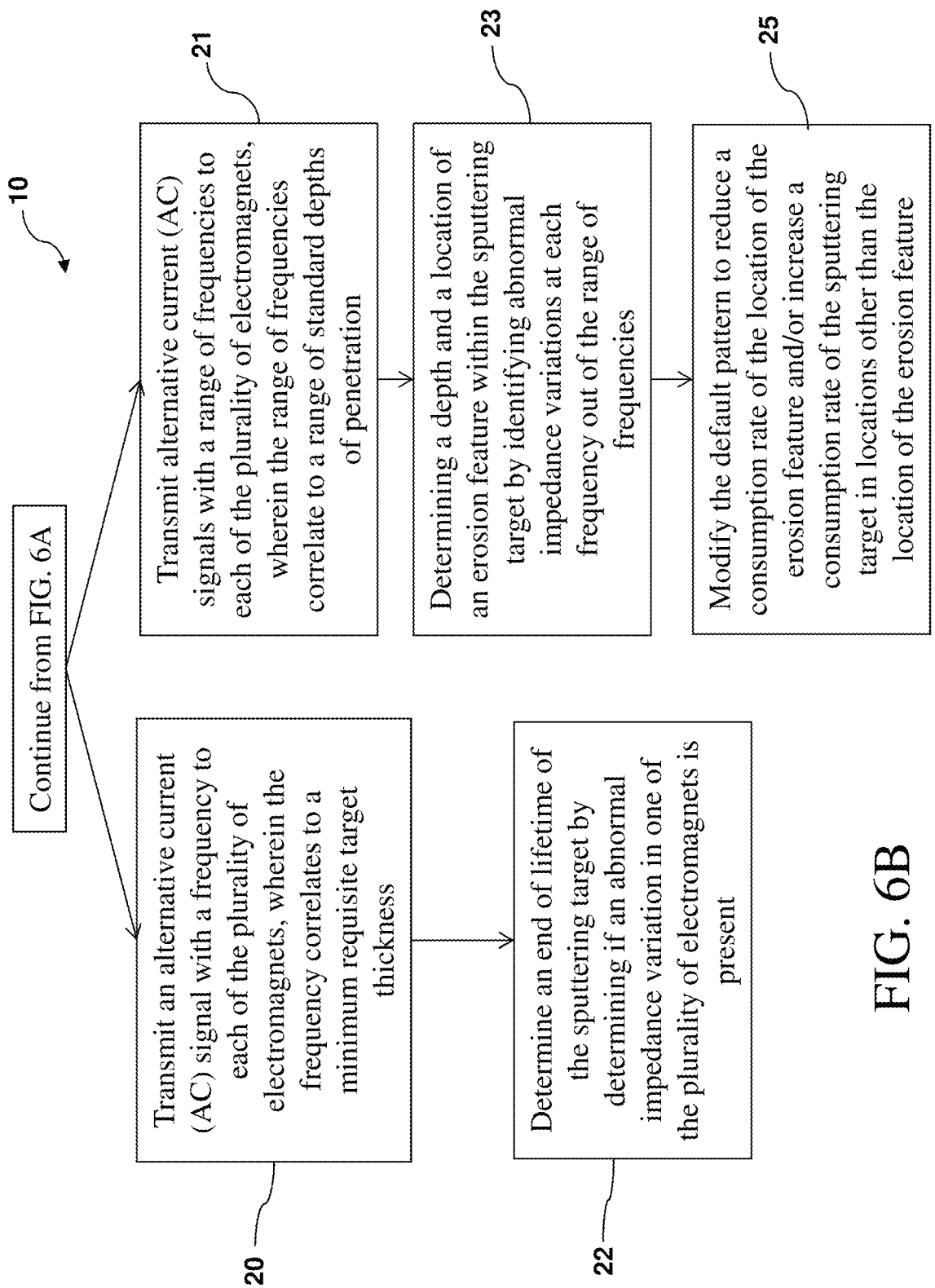

Referring now to FIGS. 6A and 6B, a method 10 for depositing a material on a substrate is provided. The method 10 is described below in conjunction with FIGS. 1-4. At operation 12 (FIG. 6A) of the method 10, the substrate 300 is placed in the vacuum chamber 110 of the sputtering system 100. The sputtering system 100 includes the vacuum chamber 110, the sputtering target 140, and the electromagnet array 200 over the sputtering target 140. The electromagnet array 200 includes a plurality of electromagnets 202. The target 140 can be formed of a metal, a conductive metallic compound, an alloy, or a metal solid solution. Examples of target materials include aluminum (Al), copper (Cu), gold (Au), nickel (Ni), cobalt (Co), manganese (Mn), titanium (Ti), tantalum (Ta), graphite (C), tungsten (W), ruthenium (Ru), molybdenum (Mo), niobium (Nb), palladium (Pd), indium (In), gallium (Ga), boron (B), antimony (Sb), vanadium (V), tin (Sn), ytterbium (Yb), yttrium (Y), zirconium (Zr), chromium (Cr) and alloys and solid solutions thereof. The target 140 can be mounted on the back plate 150. The back plate 150 and the target 140 can be formed of the same material or different materials. In some implementations, the material of the back plate 150 is selected to compensate for undesirable properties of the material of the target 140, including, for example, low thermal conductivity, low electrical conductivity, and low magnetic conductivity.

At operation 14 (FIG. 6A) of the method 10, an electric field is applied between the sputtering target 140 and the pedestal 310. As shown in FIG. 1, the pedestal 310 that holds the substrate 300 is coupled to a power supply 320 via the transmission line 322, and the target 140 is coupled to a power supply 160 via the back plate 150 and a transmission line 152. That way, an electric field can be applied across the target 140 and the substrate 300. Both the pedestal 310 and the back plate 150 are made of conductive materials. In some embodiments, the power supply 320 is a radio frequency (RF) power supply having the transmission line 322 connecting to the pedestal 310 and a grounding line 321 connected to the ground. At the operation 14, the back plate 150 and the target 140 serve as a cathode and the pedestal 310 and the substrate 300 serve as an anode. The power supplies 160 and 320 can apply a static or a dynamically changing voltage across the cathode and the anode and thereby cause an electric field to be developed between the cathode and anode.

At operation 16 (FIG. 6B) of the method 10, the plasma 170 is generated. The vacuum chamber 110 is in fluid communication with the gas source 124 via the passage 120, which is controlled by the valve 122. By opening the valve 122, the gas from the gas source 124 enters into the vacuum chamber 110. In some embodiments, the gas is an inert gas, such as argon. In some other embodiments, the gas can be oxygen, nitrogen or other suitable gases. Oxygen and nitrogen plasmas are often used in reactive sputtering processes to form oxides and nitrides. In those embodiments, the sputtering system 100 can include a second gas source for an inert gas, such as argon such that the plasma in the vacuum chamber 110 includes plasma of the inert gas along with plasma of oxygen or nitrogen. The strength of the electric field, which is generated by the power supply 160, the power supply 320, or the combination of the two, is selected such that the gas from the gas source 124 can be ionized and ignited into a plasma 170. In instances where argon (Ar) is fed from the gas source 124, Ar atoms will give up an electron and exist in the plasma 170 as positively charged argon ions ($Ar^+$). While the operation 14 is depicted as preceding the operation 16, the operation 16 can take place concurrently or after the operation 14 as well. The plasma forming gas can be present in the vacuum chamber 110 when the electric field is applied. Alternatively, the plasma forming gas can be fed to the vacuum chamber 110 after the electric field is applied.

While not described as a separate operation in the method 10, the vacuum chamber 110 is allowed to be connected to the vacuum source 134 before the plasma-forming gas is fed into the vacuum chamber 110. The vacuum chamber 110 is in fluid communication to the vacuum source 134 via the passage 130, which is controlled by the valve 132. In some embodiments, after the substrate 300 is mounted on the pedestal 310 and the target 140 is placed within the vacuum chamber 110, the valve 132 is turned to an open position to allow fluid communication between the vacuum chamber 110 and the vacuum source 134. Once the pressure with the vacuum chamber 110 reaches a steady low pressure, the valve 132 is turned to a closed position to shut off the fluid communication between the vacuum source 134 and the vacuum chamber 110. This operation ensures that no unwanted gaseous impurity be present in the vacuum chamber 110 before the deposition process. In some embodiments where the substrate 300 is transported to the sputtering system 100 by a pressurized or vacuum wafer carrier, the valve 132 can be used to reduce or minimize the pressure differential between the wafer carrier and the vacuum chamber 110.

At operation 18 (FIG. 6A) of the method 10, the plurality of electromagnets 202 in the electromagnet array 200 is energized to generate the magnetic field 180 near the target 140. The electromagnet module 200 is connected to the controller 240. The controller 240 can control the magnitude and polarity of the magnetic flux of each of the electromagnets 202 in the electromagnet module 200. By changing the magnitudes and polarities of the magnetic fluxes the electromagnets 202, the magnetic field 180 can be configured to trap secondary electrons near the target 140, thereby increasing the density of the plasma 170, facilitating the sputtering process. In some embodiments, the magnetic field 180 can be customized by changing the parameters or programs of the controller 240 for different geometries of the vacuum chamber 110, different shapes of the target 140, different materials of the target 140, different thicknesses of the target 140, different plasma gas species, and different electric field strengths. In some embodiments, for a given vacuum chamber 110 and a given type of target 140, experiments can be conducted to determine a default setting for the electromagnet array 200. The default setting is determined based on uniformity of deposition rate on the substrate 300 and the uniformity of the consumption rate of the target 140 for a given set of target material and process parameters. Each of the given set of target material and process parameters can be referred to as a standard setting. In some embodiments, each standard setting can correspond to a unique default pattern of the electromagnet array 200 to achieve uniform deposition rate and uniform target consumption. In some other embodiments, the default pattern of the electromagnet array 200 can be determined based on a standard setting that includes a target material with mid-range target properties and mid-range process parameters. In those embodiments, the default pattern is a general one for all target materials and process parameters. In some implementations, unless the controller 240 is commanded to use a specific pattern, the default pattern is loaded at the initiation of a sputtering process using the sputtering system 100.

After the operation 18 (FIG. 6A), the method 10 bifurcates into two branches. One branch includes operations 20 and 22 and the other includes operations 21, 23 and 25. Both branches include monitoring the thickness of the target 140.

In one embodiment, the method 10 determines an end of lifetime of the sputtering target 140 by determining that at least a portion of the target 140 is equal to or less than a predetermined thickness, which is referred to as a minimum target thickness. In the operation 20 (FIG. 6B), an alternating current (AC) signal with a frequency is transmitted to each of the plurality of electromagnets 202. In some embodiments, the AC signal is generated by the controller 240. As described above in conjunction with FIGS. 4 and 5, in some embodiments, each of the electromagnets 202 includes a coil 232, which can be included in the coil 221 shown in FIG. 3 or separate from the coil 221. As shown in FIG. 4, the AC signal in the coil 232 can induce the eddy current 410 within a conductive material 400, such as the target 140. The eddy current 410 has the highest current density at the surface of the conductive material 400 (or the target 140) and the eddy current density decreases by 1/e per standard depth of penetration. As shown in FIG. 5, the coil 232 can experience an impedance variation if the portion of the target 140 underneath the coil 232 includes an erosion feature 143. The frequency can be selected based on a correlation with the minimum target thickness such that the impedance variation indicates the target 140 is thinner than the minimum target thickness at least at one location. For example, the frequency can be selected such that the standard depth of penetration of that frequency is ⅕ of the minimum target thickness. In another instance, the frequency can be selected such that the standard depth of penetration of that frequency substantially equal to the minimum target thickness.

At the operation 22 (FIG. 6B) of the method 10, an end of lifetime of the sputtering target 140 is determined by determining if an abnormal impedance variation in one of the plurality of electromagnets is present. In some embodiments, the coil 221 of each of the plurality of electromagnets 202 in the electromagnet array 200 includes a coil 232. The controller 240 connected to the electromagnets 202 can transmit an AC signal to each of the coils 232 in the electromagnet array 200 to survey the target 140. The frequency of the AC signal bears a correlation with the minimum target thickness such that the presence of an erosion feature, such as the erosion feature 143, can be detected by anomaly in impedance of the coil 232. For example, if the frequency is associated with a standard depth of penetration (D) equal to ⅕ of the minimum target thickness, the impedance of each of the coil 232 should be substantially the same if no erosion feature reduces the thickness of the target 140 to less than 5 times of the standard depth of penetration (5D). If any erosion feature reduces the thickness of the target 140 to less than 5 times of the standard depth of penetration (5D) at a location, the coil 232 over that location would experience a lower impedance due to weaker counteractive magnetic flux generated by a weaker or less organized eddy current. In another example, a standard impedance of a coil 232 over a target with the minimum target thickness is measured at a frequency. Subsequently, during a survey of the target 140 using the coils 232 in the electromagnet array at the same frequency, the impedances of each of the coil 232 is compared to the standard impedance. The end of lifetime of the target 140 can then be determined if the impedance of any coil 232 falls below the standard impedance or falls below the standard impedance by a certain percentage. As demonstrated by these examples, an abnormal impedance variation is an impedance that is either an outlier as compared to impedances measured under the same frequency or different from a standard impedance measurement.

In another embodiment of the method 10, a location and a depth of an erosion feature is identified and the magnetization pattern of the electromagnet array 200 is modified to achieve more uniform target consumption. At the operation 21, AC signals with a range of frequencies are transmitted to each of the plurality of electromagnets 202. In some embodiments, the AC signals are generated by the controller 240. As different frequencies of the AC signals correspond to different standard depths of penetration, at the operation 21, the coils 232 of electromagnets 202 performs a depth-wise scan at locations under the coils 232 over the entire target 140. The coils 232 scan the target 140 with one frequency at a time and step through the range of frequencies.

At the operation 23, the depth and the location of an erosion feature within the sputtering target 140 is determined by identifying abnormal impedance variations at each frequency out of the range of frequencies. The range of frequencies corresponds to a range of standard depths of penetration. Similar to operations 20 and 22, the impedance measured at each coil 232 at a frequency out of the range of frequencies is compared among the coils 232 or against a standard impedance. The same process is repeated for each of the frequency out of the range of frequencies. As the location of each coil 232 provides location information, and the depth-scan at each frequency provides depth information, the depth and the location of an erosion feature can be determined.

At the operation 25, a magnetization pattern of the electromagnet array is modified to reduce the consumption rate of the location of the erosion feature on the target 140, or to increase the consumption rate of the locations other than the location of the erosion feature on the target 140, or both. One of the advantages provided by the electromagnet array 200 is that it is fully tunable in terms of the magnitude and polarity of the magnetic flux of each electromagnet 202 therein. Once the location and depth of the erosion feature is determined, the controller 240 can slow down the erosion at that location or speed up the erosion at other location by changing the magnetization pattern of the electromagnet array 200. For example, by increasing the strength of the magnetic field 180 at a given location, more secondary electrons can be trapped at that location and the density of the plasma 170 at that location can be increased. The higher density of the plasma 170 can speed up the erosion/consumption of the target 140 at that location. In some embodiments, the determination of the strength of the magnetization pattern at given location can also take into consideration the depth of the erosion feature. If the erosion feature is located deep in the target 140 (i.e. farther away from the target or closer to the back plate 150), the increase and reduction of consumption rate have to be more drastic. If the erosion feature is located near the surface of the target 140 (i.e. closer to the target or farther away from the back plate 150), the increase and reduction of the consumption rate can be mild. In some embodiments where magnetization pattern of the electromagnet array 200 is set at a default pattern (or default setting, default magnetization pattern), the modification at the operation 25 is done to the default pattern. In some implementations, the depths and locations of the erosion features can be compiled as a thickness distribution of the sputtering target 140 and the default pattern can be modified to achieve a more uniform thickness distribution.

Thus, the present disclosure provides embodiments of sputtering systems and methods. In one embodiment, a sputtering system is provided. The sputtering system includes a chamber configured to receive a substrate, a sputtering target positioned within the chamber, and an electromagnet array over the sputtering target. The electromagnet array includes a plurality of electromagnets. In some embodiments, the electromagnet array of the sputtering system is connected to a controller and the controller is operable to control a magnitude and a polarity of a magnetic flux of each of the plurality of electromagnets. In some implementations of the present disclosure, the electromagnet array is generally circular in shape and the electromagnet array has a center point. In some implementations, the controller is operable to sweepingly energize a predetermined pattern of electromagnets out of the plurality of electromagnets to a predetermined level around the center point. In some instances, the electromagnets other than the predetermined pattern of electromagnets are energized at a baseline level different from the predetermined level. In some embodiments, the controller is further operable to transmit an alternating current (AC) signal with a frequency to each of the plurality of electromagnets to create an eddy current within a depth of the sputtering target. The depth bears a correlation with the frequency. In those embodiments, the controller is operable to detect an impedance variation if the eddy current flows through an erosion feature in the sputtering target.

In another embodiment, a method of depositing a material on a substrate is provided. The method includes placing the substrate in a chamber of a sputtering system. The sputtering system includes the chamber, a sputtering target positioned within the chamber, and an electromagnet array over the sputtering target. The electromagnet array includes a plurality of electromagnets; The method further includes applying an electric field between the sputtering target and the substrate; generating a plasma within the chamber; and energizing the plurality of electromagnets in the electromagnet array. In some embodiments, the energizing of the plurality of electromagnets includes energizing the plurality of electromagnets according to a default pattern that results in a uniform deposition thickness on the substrate and a uniform consumption rate across the sputtering target in a standard setting. In some embodiments, the method further includes modifying the default pattern based on a thickness distribution of the sputtering target.

In some implementations, the method according to the present disclosure further includes transmitting an alternating current (AC) signal with a frequency to each of the plurality of electromagnets, wherein the frequency correlates to a minimum target thickness. In some implementations, the method further includes determining an end of lifetime of the sputtering target by determining if an abnormal impedance variation in one of the plurality of electromagnets is present. In some embodiments, the method further includes transmitting alternating current (AC) signals with a range of frequencies to each of the plurality of electromagnets, wherein the range of frequencies correlate to a range of standard depths of penetration. In some implementations, the method further includes determining a depth and a location of an erosion feature within the sputtering target by identifying abnormal impedance variations at each frequency out of the range of frequencies. In some instances, the method further includes modifying the default pattern to reduce a consumption rate of the location of the erosion feature. In some embodiments, the method further includes modifying the default pattern to increase a consumption rate of the sputtering target in locations other than the location of the erosion feature. In some implementations, the erosion feature is a concave erosion profile resulted from localized consumption of the sputtering target.

In yet another embodiment, a method of determining an end of lifetime of a sputtering target is provided. The method includes placing a substrate in a chamber of a sputtering system. The sputtering system includes the chamber, the sputtering target positioned within the chamber, and an electromagnet array over the sputtering target. The electromagnet array includes a plurality of electromagnets. The method further includes transmitting an alternating current (AC) signal with a frequency to each of the plurality of electromagnets, wherein a standard depth of penetration of the frequency correlates to a minimum target thickness; and determining an end of lifetime of the sputtering target by determining if an abnormal impedance variation is present in one of the plurality of electromagnets is present. In some embodiments, determining if an abnormal impedance variation is present in one of the plurality of electromagnets includes comparing impedance variations in the plurality of electromagnets. In some embodiments, the standard depth of penetration is inversely proportional to a square root of the frequency and a square root of an electrical conductivity of the sputtering target.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A sputtering system, comprising:
a chamber configured to receive a substrate;
a sputtering target positioned within the chamber;

an electromagnet array over the sputtering target, the electromagnet array including a plurality of electromagnets, each of the plurality of electromagnets comprising a core that extends perpendicular to the sputtering target; and a controller communicatively coupled to the electromagnet array to:
  generate a magnetization pattern in the electromagnet array,
  perform a depth-wise scan of the sputtering target by transmitting a plurality of alternating current (AC) signals with a plurality of different frequencies to each of the plurality of electromagnets to identify a location and a depth of an erosion feature, each frequency of the plurality of different frequencies corresponding to a single standard depth of penetration, and
  modify the magnetization pattern based on the identification of the location and depth of the erosion feature.

2. The sputtering system of claim 1, wherein the controller is configured to control a magnitude and a polarity of a magnetic flux of each of the plurality of electromagnets.

3. The sputtering system of claim 2, wherein the electromagnet array is circular in shape, the electromagnet array having a center point.

4. The sputtering system of claim 3, wherein the magnetization pattern comprises a predetermined pattern of electromagnets out of the plurality of electromagnets to a predetermined level around the center point.

5. The sputtering system of claim 4, wherein the electromagnets other than the predetermined pattern of electromagnets is energized at a baseline level different from the predetermined level.

6. A method of depositing a material on a substrate, comprising:
  placing the substrate in a chamber of a sputtering system, the sputtering system including:
    the chamber,
    a sputtering target positioned within the chamber, and
    an electromagnet array over the sputtering target, the electromagnet array including a plurality of electromagnets, each of the plurality of electromagnets comprising a core that extends perpendicular to the sputtering target;
  applying an electric field between the sputtering target and the substrate;
  generating a plasma within the chamber;
  energizing the plurality of electromagnets in the electromagnet array; and
  performing a depth-wise scan of the sputtering target by transmitting a plurality of alternating current (AC) signals with a plurality of different frequencies to each of the plurality of electromagnets, each frequency of the plurality of different frequencies corresponding to a single standard depth of penetration.

7. The method of claim 6, wherein the energizing of the plurality of electromagnets comprises energizing the plurality of electromagnets according to a default pattern that results in a uniform deposition thickness on the substrate and a uniform consumption rate across the sputtering target in a standard setting.

8. The method of claim 7, further comprising modifying the default pattern based on a thickness distribution of the sputtering target.

9. The method of claim 6, further comprising transmitting an alternating current (AC) signal with a frequency to each of the plurality of electromagnets, wherein the frequency correlates to a minimum target thickness.

10. The method of claim 9, further comprising determining an end of lifetime of the sputtering target by determining if an abnormal impedance variation in one of the plurality of electromagnets is present.

11. The method of claim 7, further comprising transmitting alternating current (AC) signals with a range of frequencies to each of the plurality of electromagnets, wherein the range of frequencies correlate to a range of standard depths of penetration.

12. The method of claim 11, further comprising determining a depth and a location of an erosion feature within the sputtering target by identifying abnormal impedance variations at each frequency out of the range of frequencies.

13. The method of claim 12, further comprising modifying the default pattern to reduce a consumption rate of the location of the erosion feature.

14. The method of claim 12, further comprising modifying the default pattern to increase a consumption rate of the sputtering target in locations other than the location of the erosion feature.

15. The method of claim 12, wherein the erosion feature is a concave erosion profile resulted from localized consumption of the sputtering target.

16. A method, comprising:
  placing a substrate in a chamber of a sputtering system, the sputtering system including:
    the chamber,
    a sputtering target positioned within the chamber, and
    an electromagnet array over the sputtering target, the electromagnet array including a plurality of electromagnets, each of the plurality of electromagnets comprising a core that extends perpendicular to the sputtering target;
  igniting a plasma in the chamber;
  generating a magnetic field near the sputtering target using the electromagnet array to increase a density of the plasma;
  performing a depth-wise scan of the sputtering target by transmitting a plurality of AC signals with a plurality of different frequencies to each of the plurality of electromagnets, each frequency of the plurality of different frequencies corresponding to a single standard depth of penetration;
  transmitting an alternating current (AC) signal with a selected frequency to each of the plurality of electromagnets of the electromagnet array, wherein a standard depth of penetration of the selected frequency correlates to a minimum target thickness; and
  determining an end of lifetime of the sputtering target by determining if an abnormal impedance variation is present in one of the plurality of electromagnets is present.

17. The method of claim 16, wherein determining if an abnormal impedance variation is present in one of the plurality of electromagnets comprises comparing impedance variations in the plurality of electromagnets.

18. The sputtering system of claim 1, wherein each of the plurality of electromagnets further comprises a coil.

19. The sputtering system of claim 18, wherein, to perform the depth-wise scan, the controller is configured to:
  measure an impedance in the coil of each of the plurality of electromagnets at each frequency of the plurality of different frequencies; and
  compare the impedance to a standard impedance.

20. The method of claim 16, wherein the performing of the depth-wise scan comprises:
   measuring an impedance of each of the plurality of electromagnets at each frequency of the plurality of different frequencies; and
   comparing the impedance to a standard impedance.

\* \* \* \* \*